United States Patent
Kiryu

(10) Patent No.: US 7,103,495 B2
(45) Date of Patent: Sep. 5, 2006

(54) SYSTEM AND METHOD FOR BURN-IN TEST CONTROL

(75) Inventor: Naoki Kiryu, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 10/943,567

(22) Filed: Sep. 17, 2004

(65) Prior Publication Data

US 2006/0064265 A1 Mar. 23, 2006

(51) Int. Cl.
*G06F 13/14* (2006.01)

(52) U.S. Cl. .............. 702/117; 702/118; 702/186; 702/188

(58) Field of Classification Search ............. 702/59, 702/64, 117–119, 182, 188, 186; 324/760; 711/118; 714/733
See application file for complete search history.

(56) References Cited

U.S. PATENT DOCUMENTS

| | | | | |
|---|---|---|---|---|
| 5,954,832 | A * | 9/1999 | LeBlanc | 714/724 |
| 5,983,380 | A | 11/1999 | Motika et al. | 714/733 |
| 6,407,567 | B1 | 6/2002 | Etter | 324/760 |
| 6,760,873 | B1 * | 7/2004 | Hao et al. | 714/724 |
| 2002/0121913 | A1 * | 9/2002 | Miller et al. | 324/760 |
| 2004/0103355 | A1 * | 5/2004 | Correale et al. | 714/733 |

* cited by examiner

*Primary Examiner*—Marc S. Hoff
*Assistant Examiner*—Felix Suarez
(74) *Attorney, Agent, or Firm*—Law Offices of Mark L. Berrier

(57) ABSTRACT

Systems and methods for controlling test conditions using logic built-in self-test (LBIST) components to affect test conditions. In one embodiment, an LBIST controller is coupled to LBIST circuitry that is incorporated into the design of a device under test, and also to a thermal sensor that is in thermal communication with the device under test. The LBIST controller is configured to receive device temperature information from the thermal sensor and to modify control signals that are provided to the LBIST circuitry in order to cause the LBIST circuitry to operate in a manner that drives the device temperature to a desired level. In one embodiment, the LBIST controller adjusts the speed with which the LBIST circuitry scans data into and out of a plurality of scan chains, thereby adjusting the amount of heat generated by this operation, which in turn affects the temperature of the device.

8 Claims, 6 Drawing Sheets

SYSTEM AND METHOD FOR BURN-IN TEST CONTROL

BACKGROUND

1. Field of the Invention

The invention relates generally to the testing of electronic circuits, and more particularly to systems and methods for controlling test conditions using available logic built-in self-test (LBIST) components to affect the test conditions.

2. Related Art

Electronic devices consist of many individual components that are interconnected in such a way as to provide the functionality of the device. Each of the individual components that make up the device has an associated likelihood that the component will fail. If one of the components fails, the functions performed by component will no longer be performed, so the device fails as well.

The failure rates for electronic devices normally change over time. For a typical device, the failure rate will initially be relatively high. This high initial failure rate is due to components that are defective and therefore prone to failure. For those devices that do not have any components that are defective and therefore likely to fail in this initial interval, the failure rate will drop from the relatively high initial levels to much lower levels, and will remain at these lower levels for a relatively long period of time. At some point, the failure rates will increase again as the components began to wear out. At this point, the devices have reached the ends of their useful lives, and the failures are the result of "old age," rather than defective components.

Many product manufacturers, in order to avoid providing customers with products that are likely to fail soon after they are purchased, perform some type of testing to identify these defective products so that they will not be sold to customers. Typically, a type of testing called "burn-in" testing is used to identify these defective products. Burn-in testing simulates actual use of the product and causes the initial part of a product's lifetime to be used up in testing. This causes defective products to fail at the manufacturer's facility during testing, rather than in a customer's possession during normal operation by the customer.

After the initial portion of the product lifetime has passed and the likelihood of failure has fallen from the initial high levels to lower, acceptable levels, the product can be sold to a customer with a high level of confidence that the product will not fail for a relatively long period of time.

Burn-in testing typically simulates worst-case conditions that might be experienced by the product in normal use. For example, in the case of electronic devices, burn-in testing often entails operation of the device at high voltages, and at high temperatures. Even though the test conditions may be harsh, it is nevertheless desirable to control the test conditions so that they are applied consistently to each of the devices that undergo burn-in testing. The control of the test conditions as desirable because, while it is useful to subject the devices to the harshest conditions that may be encountered during normal use, it is counterproductive to make the conditions more harsh than could be expected, as this could cause the failure of products that would not have failed during normal use.

In order to maintain the proper conditions for burn-in testing, it may be necessary to design or purchase complicated test equipment. For instance, in the case of electronic devices such as microprocessors or other large-scale integrated circuits, it is not unusual to test the devices using expensive test machines that are capable of individually controlling the test conditions for many different devices at the same time. These test machines typically individually control the voltages provided to each of the devices, and even individually heat and/or cool the different devices to maintain the proper temperature. It is easy to understand that, because of their complexity, these test machines are typically very expensive to purchase and very expensive to operate.

It would therefore be desirable to provide systems and methods for performing burn-in testing of devices such as microprocessors or large-scale integrated circuits that eliminates the need for the complex test machinery that is currently used and it makes the burn-in testing process more efficient and more inexpensive than conventional systems and methods.

SUMMARY OF THE INVENTION

One or more of the problems outlined above may be solved by the various embodiments of the invention. Broadly speaking, the invention includes systems and methods for controlling test conditions using logic built-in self-test (LBIST) components to affect test conditions. In one embodiment, an LBIST controller is coupled to LBIST circuitry that is incorporated into the design of a device under test, and also to a thermal sensor that is in thermal communication with the device under test.

The LBIST controller is configured to receive device temperature information from the thermal sensor and to modify control signals that are provided to the LBIST circuitry in order to cause the LBIST circuitry to operate in a manner that drives the device temperature to a desired level. In one embodiment, the LBIST controller adjusts the speed with which the LBIST circuitry scans data into and out of a plurality of scan chains, thereby adjusting the amount of heat generated by this operation, which in turn affects the temperature of the device.

One embodiment comprises a method including monitoring a temperature of each of one or more devices under test, where each device incorporates LBIST circuitry, and controlling operation of the LBIST circuitry of each device in response to the temperature of the device.

The operation of the LBIST circuitry may be controlled by adjusting a speed with which the LBIST circuitry is operated (e.g., the scan shift speed) in each device. If the temperature of the device is too low, the scan shift speed is increased, to drive the temperature up. If the temperature of the device is too high, the scan shift speed is decreased, to drive the temperature down. The method may be used to independently control the LBIST circuitry of each device and to drive the temperature of each device toward a target temperature range.

An alternative embodiment comprises an LBIST controller. The LBIST controller is configured to receive temperature signals from a thermal sensor, determine whether the temperature of the corresponding device under test is at a desired level, and generate control signals to drive LBIST circuitry within the device to generate more, less, or the same amount of heat. In one embodiment, the LBIST controller includes a first comparator configured to compare the temperature of the device under test to upper and lower threshold temperature values. The first comparator provides control signals to a scan shift speed selector which selects scan shift speeds at which the LBIST controller drives the LBIST circuitry within the device under test. The scan shift speed selector provides a selected rate to a second comparator which is configured to compare the selected scan shift speed to a binary counter and to gating signal. The gating signal is AND'ed with a clock signal to provide clock pulses to the LBIST circuitry within the device under test at a selected rate. By changing the selected scan shift rate, the LBIST controller changes the power consumed by the LBIST circuitry and the corresponding amount of heat generated by the LBIST circuitry, which in turn affects the temperature of the device under test.

Another alternative embodiment comprises a system that includes LBIST circuitry in a device under test, a LBIST controller coupled to and configured to control the LBIST circuitry, and a thermal sensor configured to measure the temperature of the device under test. The LBIST controller is configured to receive a temperature signal from the thermal sensor and to control the operation of the LBIST circuitry to drive the temperature to a desired level. If the temperature of the device is too low, the LBIST circuitry is operated to drive the temperature up. If the temperature of the device is too high, the LBIST circuitry is operated to drive the temperature down. The operation of the LBIST circuitry may be adjusted by adjusting the scan shift speed of the LBIST circuitry. The LBIST controller and the thermal sensor may either be internal to the device under test, or external to it (e.g., part of a test station.)

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
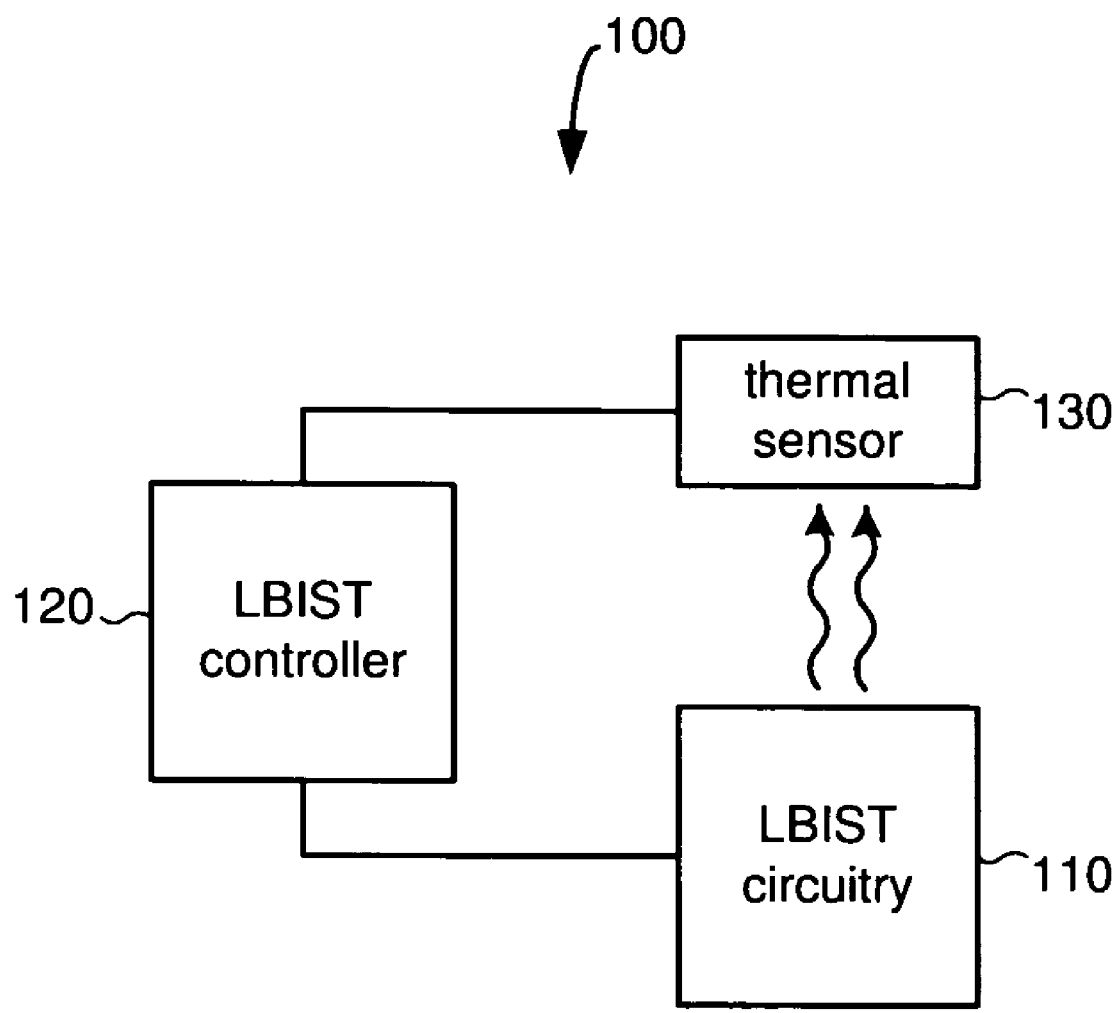
FIG. 1 is a functional block diagram of an LBIST system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

Broadly speaking, the invention includes systems and methods for controlling test conditions using logic built-in self-test (LBIST) components to affect test conditions. In one embodiment, an LBIST controller is coupled to LBIST circuitry that is incorporated into the design of a device under test, and also to a thermal sensor that is in thermal communication with the device under test. The LBIST controller is configured to receive device temperature information from the thermal sensor and to modify control signals that are provided to the LBIST circuitry in order to cause the LBIST circuitry to operate in a manner that drives the device temperature to a desired level.

In one embodiment, the LBIST circuitry that is incorporated into the device under test is designed to generate pseudorandom bit patterns, load these bit patterns into chains of scan latches that are interposed between the functional logic of the device under test, propagate the bit patterns through the functional logic, and unload the resulting bit patterns so that they can be examined to determine whether the device under test is operating properly. The loading and unloading of the data in the scan chains occurs in what is referred to as a scan shift phase. The propagation of the data through the functional logic occurs during what is referred to as a functional phase.

During a burn-in test, the LBIST circuitry is operated, so that data in the scan chains is alternately loaded/unloaded (during the scan shift phase) and propagated through the functional logic (during the functional phase.) During the burn-in test, heat is generated by the device under test. One component of this heat corresponds to relatively constant factors, such as DC power leakage, clock leakage and normal operation of the device during the functional phase of LBIST operation. Another component of the heat generated by the device corresponds to the operation of the LBIST circuitry during the scan shift phase. This operation can be controlled so that the corresponding amount of heat that is generated in the device can be increased or decreased. Thus, if the temperature of the device is too high, the scan shift operations can be controlled in a way that causes less power to be consumed and less heat to be generated. If, the other hand, the temperature of the device is too low, the scan shift operations can be controlled in a way that causes more power to be consumed and thereby causes more heat to be generated. As a result, operation of the LBIST circuitry during the scan shift phase can drive the temperature of the device to a desired level.

In one embodiment, the LBIST controller is configured to control the LBIST operation during the scan shift phase by adjusting the speed with which the LBIST circuitry scans data into and out of the plurality of scan chains.

Each time the data is shifted in one of the scan chains, a corresponding incremental amount of power is consumed (and heat generated.) By causing these shifts to occur at a higher or lower rate, the LBIST controller causes more or less power to be consumed (and more or less heat to be generated.) Thus, in this embodiment, the LBIST controller monitors the temperature of the device and, if the temperature is higher than desired, the scan shift speed of the LBIST circuitry is reduced, so that the device will cool down. If the temperature is lower than desired, the scan shift speed of the LBIST circuitry is increased, so that the device will heat up. The details of this embodiment will be described below.

As noted above, one embodiment is implemented in an electrical circuitry testing environment. In particular, this embodiment may be used to test integrated circuits such as microprocessors. Typically, many integrated circuits will be subjected to burn-in testing at the same time, using the same test equipment.

For example, multiple processors may be plugged into sockets on a motherboard that is part of the test system. It is desired to subject to all of the processors to the same set of test conditions (the test profile.)

It should be noted that, although the embodiments described herein focus on the testing of microprocessors, the various embodiments of the invention may be implemented in the testing of other types of integrated circuits, and other types of devices that implement built-in sel-testing. Accordingly, references to "microprocessors," "integrated circuits," "circuitry" and the like should be construed broadly, and should not be interpreted as limiting the scope of the invention.

During burn-in testing, the devices being tested (e.g., microprocessors) are operated, thereby generating heat.

The heat that is generated by each of the devices can be characterized as having several components. For example, one component of the heat results from simply applying power to the device. This component can be referred to as a DC leakage component. Another component of the heat results from the normal operation of the device. In the case of a microprocessor, power is expended in the execution of program instructions, resulting in the generation of a corresponding amount of heat. This component can be referred to as an AC leakage component. The AC leakage component may also include heat that is generated by operation of LBIST circuitry within the device that might not be considered to be within the "normal operation" of the device (because the LBIST circuitry exists for the purpose of testing the device, rather than enabling it to function.)

Conventionally, the devices under test are operated without regard to the test conditions. In other words, the manner in which each device is operated is unrelated to the test conditions for the device. Thus, the operation of the device (failures notwithstanding) will be the same, regardless of whether or not the temperature of the device is within desired ranges of temperatures, voltages, and the like for the test procedure. These conditions are controlled by test equipment, rather than the devices under test. For example, as noted above, typical burn-in test equipment for integrated circuits includes heating and cooling elements corresponding to each of the devices under test, so that the temperature of each device can be controlled, independent of the temperatures of each of the other devices.

In one embodiment, each of the devices under test incorporates LBIST circuitry. The LBIST circuitry is operated during the burn-in testing and is controlled in such a manner as to control the heat being generated by the device. If the temperature of the device is below a desired temperature, the LBIST circuitry is operated in a way that generates more heat and thereby increases the temperature of the device. If the temperature of the device is above a desired temperature, the LBIST circuitry is operated in a way that reduces the amount of heat generated by the device and thereby decreases the temperature of the device.

Referring to FIG. 1, a functional block diagram of a system in accordance with one embodiment is shown. In this embodiment, system 100 includes LBIST circuitry 110, LBIST controller 120 and thermal sensor 130. LBIST circuitry 110 is incorporated into the design of the device under test, as will be described in more detail below. LBIST controller 120 is coupled to LBIST circuitry 110 and is configured to control the manner in which LBIST circuitry 110 operates. LBIST controller 120 is also coupled to thermal sensor 130. Thermal sensor 130 is positioned at or near the device under test (hence LBIST circuitry 110) so that it can sense the temperature of the device under test. Temperature information is then provided by thermal sensor 130 to LBIST controller 120. LBIST controller 120 is configured to adjust the manner in which LBIST circuitry 110 is controlled, and to thereby adjust the temperature of the device under test.

It should be noted that, while LBIST circuitry 110 is necessarily incorporated into the design of the device under test, LBIST controller 120 and thermal sensor 130 may either be incorporated into the design of the device, or configured as separate test components. If LBIST controller 120 and thermal sensor 130 are incorporated into the design of the device under test, the external test system (e.g., the motherboard to which the microprocessors are connected for burn-in test purposes and the corresponding systems for controlling voltages and other test parameters) may be configured in a way that is very similar to conventional test apparatus. There would, however, be no need for components that would normally be used to individually control the temperatures of the devices under test (e.g., individual heaters and coolers for the devices.) If LBIST controller 120 and thermal sensor 130 are incorporated into the test apparatus, it would obviously be necessary to provide the appropriate connections for control of the on-chip LBIST circuitry (and for receiving temperature information from thermal sensor 130, if this sensor is also located within the device under test.)

It should also be noted that FIG. 1 depicts a single component for each of the LBIST controller, LBIST circuitry and thermal sensor. This is illustrative of an embodiment in which each device under test has a corresponding one of these components (i.e., the structure of FIG. 1 is replicated for each device under test. This may not be true of all embodiments, however. For example, in one embodiment, a single controller may receive temperature information from a plurality of thermal sensors and use this information to adjust the operation of LBIST circuitry in multiple devices under test. Other such variations may be possible as well.

Figure 2:
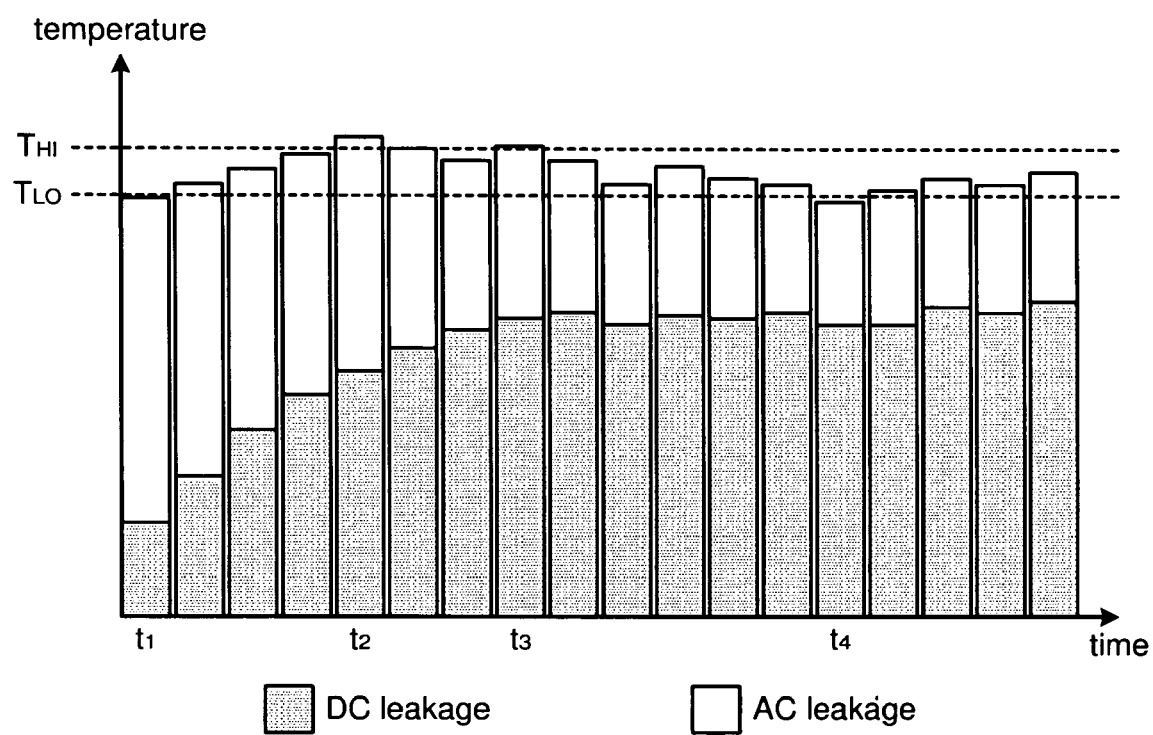
FIG. 2 is a diagram illustrating the effect of a burn-in test system in accordance with one embodiment on the temperature of a particular device under test.

Referring to FIG. 2, a diagram illustrating the effect of a burn-in test system in accordance with one embodiment on the temperature of a particular device under test is shown. In this figure, the temperature of the device under test is depicted as a set of vertical bars corresponding to a series of points in time. At each of the series of points in time, the temperature of the device under test is represented by a single vertical bar having a shaded portion and an unshaded portion. The height of the vertical bar (including both the shaded portion and the unshaded portion) represents the temperature of the device at that time. The shaded portion of the bar represents the contribution of DC leakage to the generated heat and the resulting temperature. The unshaded portion of the bar represents the contribution of AC leakage to the generated heat and the resulting temperature. The AC leakage component of the generated heat may be broken down into various subcomponents, such as contributions corresponding to clock leakage, operation of the functional circuitry of the device, and operation of the LBIST circuitry within the device.

Two temperatures, THI and TLO, are indicated on the graph of FIG. 2 by corresponding dotted lines. In one embodiment, these temperatures serve as high and low temperature thresholds, respectively. LBIST controller 120 is designed to keep the temperature of the corresponding device under test between these two threshold temperatures.

If the temperature of the device rises above temperature THI, LBIST controller 120 modifies the operation of LBIST circuitry 110 so that less heat is generated by the device under test. For example, at times t2 and t3, the temperature of the device is above THI, so LBIST circuitry 110 is operated so as to generate less heat, thereby decreasing the temperature. If the temperature of the device falls below temperature TLO, LBIST controller 120 modifies the operation of the LBIST circuitry so that more heat is generated by the device. For instance, at times t1 and t4, the temperature is below TLO, so the LBIST circuitry is operated in a way that generates more heat, thereby raising the temperature.

It should be noted that, in one embodiment, temperatures THI and TLO may be selected so that they are entirely within the desired temperature range. For instance, if it is desired to maintain a temperature of the device under test between 120 F and 130 F, THI may be set to 128 F, and TLO may be set to 122 F By making the range from TLO to THI less than the desired temperature range, it may be possible to prevent the temperature of the device from exceeding the desired high temperature (130 F) or falling below the desired low temperature (120 F) Alternatively, a single temperature value may be used for both TLO and THI. In this case, the LBIST controller will constantly update the operation of the LBIST circuitry based upon whether the temperature of the device under test is above or below the single threshold value.

In one embodiment, the LBIST controller causes the LBIST circuitry to generate more or less heat by controlling the speed at which the LBIST circuitry operates. More particularly, the LBIST controller can adjust the rate at which data patterns that are generated by the LBIST circuitry are scanned into and out of serially connected scan latches within the device under test. This rate is also referred to as the scan shift speed. The manner in which the LBIST circuitry operates (including the scanning of data into and out of the scan latches) is discussed in more detail below. At this point, it should simply be noted that, if data is scanned into the scan latches more slowly, less power is used by the LBIST circuitry, and less heat is generated. If data is scanned into the scan latches more quickly, more power is used by the LBIST circuitry, and more heat is generated. The speed with which the data is scanned into the scan latches also affects the amount of power used by the functional circuitry within the device under test, in that, when it takes longer to scan the data into the scan latches, the functional circuitry is operating for a lower percentage of the time and consequently uses less power, on the average.

Figure 3:
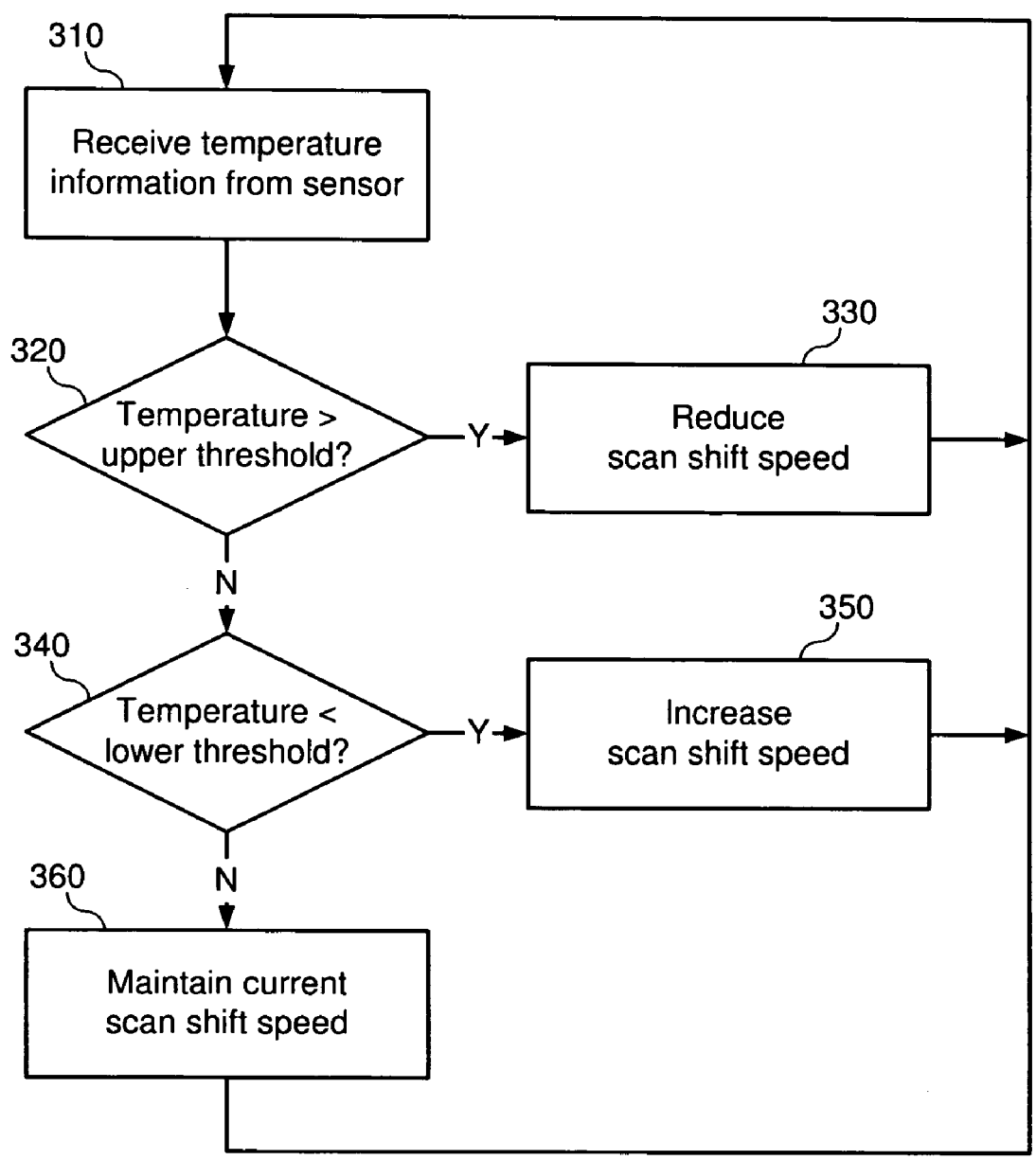
FIG. 3 is a flow diagram illustrating a method implemented in the LBIST controller in accordance with one embodiment to drive the temperature of the device under test to a target temperature range.

The operation of this system is summarized in the diagram of FIG. 3. FIG. 3 is a flow diagram illustrating a method implemented in the LBIST controller to drive the temperature of the device under test to a target temperature range. The method of FIG. 3 is continually repeated. Each iteration of the method corresponds to a transition from one of the vertical bars of FIG. 2 to another.

As depicted in FIG. 3, the method begins with the LBIST controller receiving temperature information from the thermal sensor (block 310.) The LBIST controller first compares the temperature to an upper threshold temperature (block 320.) If the temperature received from the thermal sensor is greater than the upper threshold temperature, the LBIST controller reduces the scan shift speed of the LBIST circuitry (block 330.) As described above, this causes less heat to be generated by the device under test and consequently causes the temperature of the device to fall. The method then returns to the receipt of temperature information from the thermal sensor (block 310.)

If, when the LBIST controller compares the device temperature to the upper threshold temperature (block 320,) the temperature is not greater than the upper threshold temperature, the LBIST controller compares the device temperature to a lower threshold temperature (block 340.) If the temperature received from the thermal sensor is less than the lower threshold temperature, the LBIST controller increases the scan shift speed of the LBIST circuitry (block 350.) This causes more heat to be generated by the device and, as a result, the temperature of the device is caused to fall.

The method then returns to the receipt of temperature information from the thermal sensor (block 310.)

If the device temperature is neither greater than the upper threshold temperature (block 320,) nor less than the lower threshold temperature (block 340,) then the device temperature is within the desired temperature range. Consequently, the LBIST controller maintains the current scan shift speed for the LBIST circuitry (block 360.) This, in turn, causes the device to generate the same amount of heat and to maintain a roughly constant temperature level. The method then returns to block 310, at which the LBIST controller receives new temperature information from the thermal sensor.

Before describing the manner in which the LBIST controller causes the LBIST circuitry to generate more or less heat, it will be helpful to describe the structure and operation of the LBIST system as implemented in one embodiment.

As noted above, LBIST stands for "logic built-in self-test." LBIST systems incorporate circuit components into the design of the circuit to be tested, where the additional, LBIST circuit components are used for purposes of testing the functional portion of the circuitry. In one embodiment, as shown in FIG. 1, the LBIST system includes an LBIST controller and LBIST circuitry within the device under test. The LBIST circuitry within the device includes a plurality of scan chains interposed between levels of the functional logic of the device. Typically, pseudorandom patterns of bits are generated and stored in the scan chains. This may be referred to as scanning the data into the scan chains. After a pseudorandom bit pattern is scanned into a scan chain, the data is propagated through the functional logic to a subsequent scan chain. The data is then scanned output of the subsequent scan chain and processed to determine whether or not the functional logic operated properly. Conventionally, the process of scanning data into the scan chains, propagating the data through the functional logic, scanning the data out of the scan chains and processing the data is repeated many times before the data is examined to determine whether or not the functional logic operated as expected.

Figure 4:
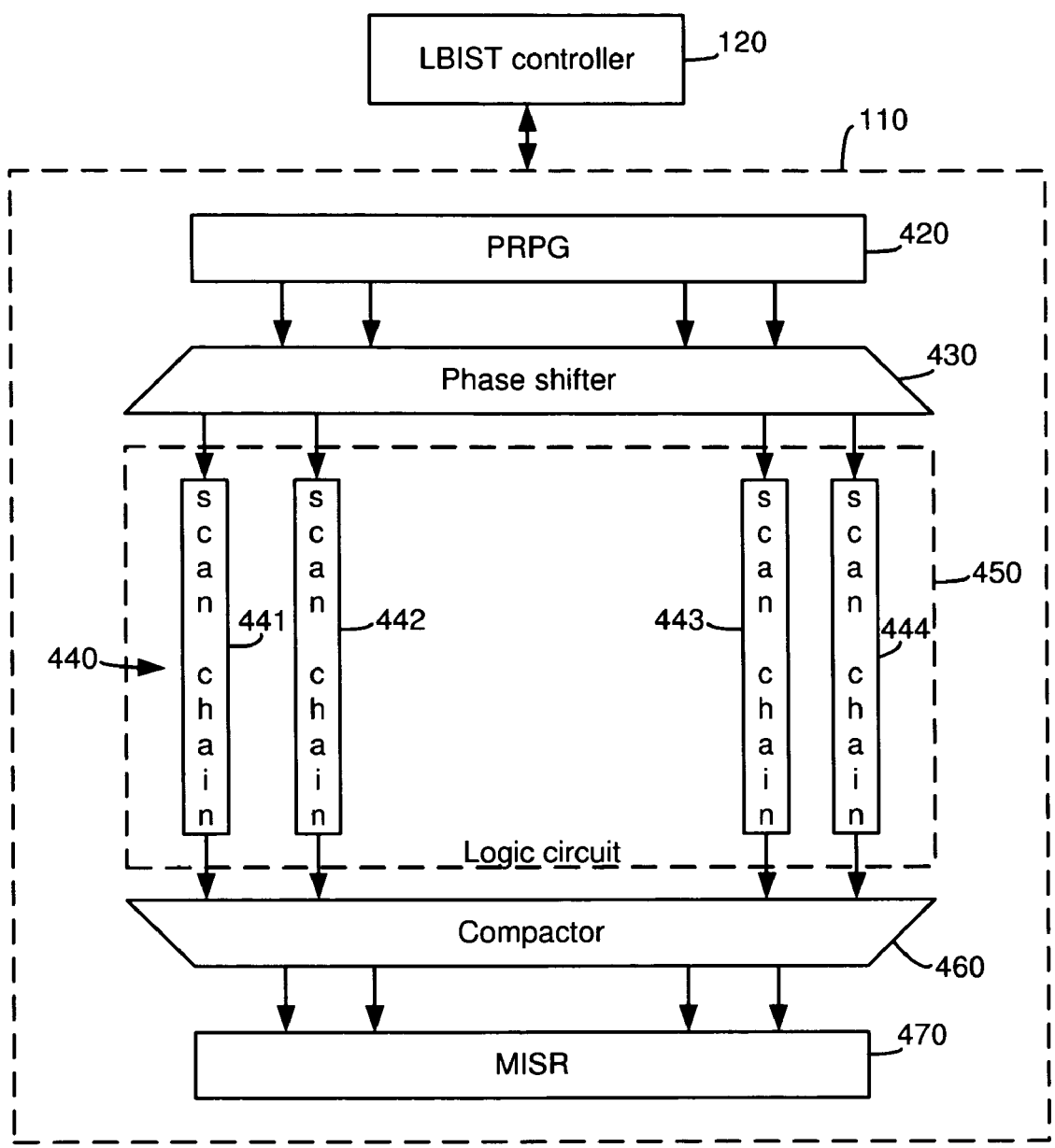
FIG. 4 is a functional block diagram illustrating the structure of LBIST circuitry within a device under test in accordance with one embodiment.
Figure 5:
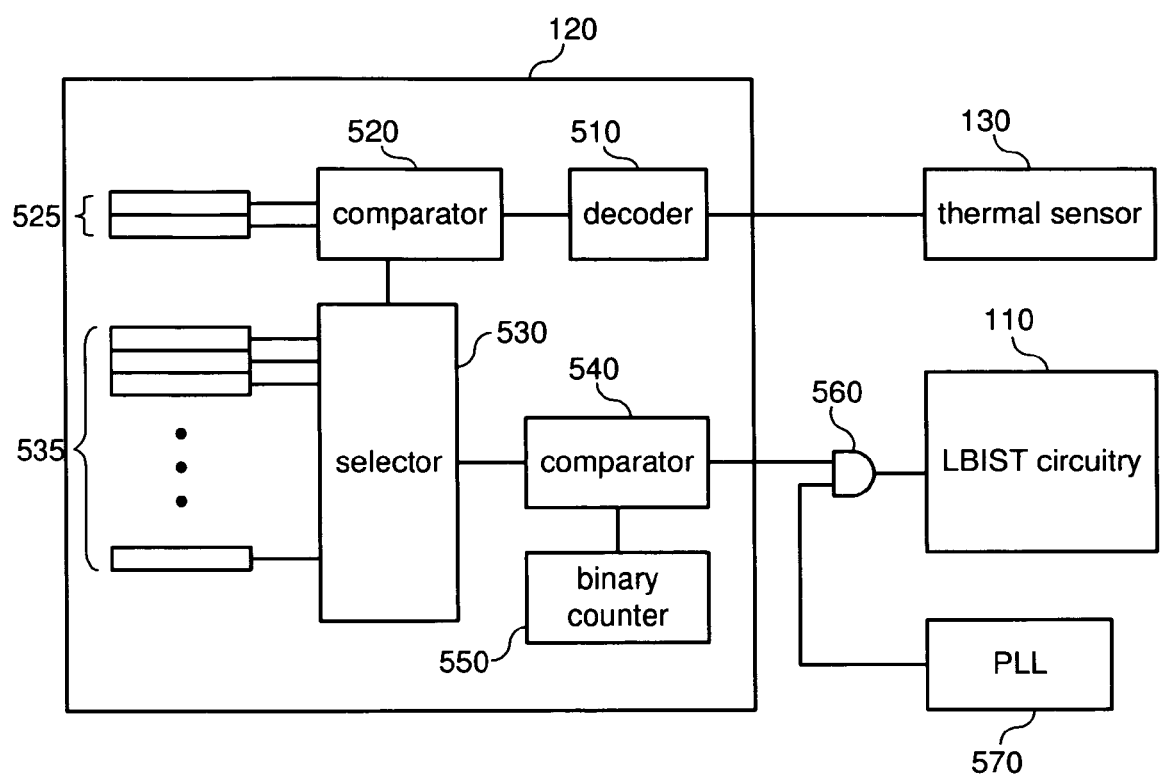
FIG. 5 is a functional block diagram illustrating the structure of an LBIST controller in accordance with one embodiment.

Referring to FIGS. 4 and 5, a pair of functional block diagrams illustrating an LBIST architecture in accordance with one embodiment are shown. The diagram of FIG. 4 shows the LBIST circuitry in more detail, while the diagram of FIG. 5 shows the LBIST controller in more detail.

Referring to FIG. 4, the architecture of the LBIST circuitry is generally referred to as a STUMPS LBIST architecture. The STUMPS architecture makes use of pseudorandom patterns that are loaded into scan latches, propagated through the functional components of the logic circuit under test, unloaded from the scan latches, and captured in a multiple input signature register. As depicted in FIG. 4, the LBIST system comprises an LBIST controller 120 and LBIST circuitry 110. LBIST circuitry 110 includes a PRPG 420, a phase shifter 430, a set of scan chains 440, a compacter 460 and a MISR 470. These LBIST components are integrated with a logic circuit 450, which the LBIST components are designed to test.

LBIST controller 120 includes control circuitry that controls the operation of LBIST circuitry 110. (For purposes of clarity, LBIST controller 120 is depicted as being coupled to the components of LBIST circuitry 110 as a group, although the controller is typically coupled directly to various ones of the components.) One of the functions of LBIST controller 120 is to provide a seed value to PRPG 420. Based upon this seed value, PRPG 420 generates a pseudorandom sequence of bits that are processed by phase shifter 430 and loaded into scan chains 440. It should be noted that, while only four scan chains are depicted in FIG. 4, there may be many scan chains in the LBIST design.

PRPG 420 can be implemented as a linear feedback shift register (LFSR). The purpose of the pseudorandom sequence of bits generated by PRPG 420 is to provide a set of input bits to be propagated through the functional logic components of logic circuit 450. The pseudorandom sequence is therefore provided to each of the scan chains 440. It should be noted, however, that the pseudorandom bit sequence is loaded into scan chains 440 only after being processed by phase shifter 430.

The purpose of phase shifter 430 is to make the character of the bit sequences loaded into scan chains 440 more random. When a LFSR is used to generate the pseudorandom bit pattern, to be shifted into the scan chains, the sequence in each successive column may be identical to the sequence in the preceding column, except that the sequence is shifted down by one bit. Thus, there is a clearly identifiable pattern within the "random" sequences of bits. Phase shifter 430 shifts the phase of the pseudorandom sequence of bits so that no such pattern is identifiable within the succeeding bit sequences. Essentially, phase shifter 430 operates by shifting the phase of each succeeding column with respect to the preceding column. In other words, rather than being offset by a single bit in each succeeding column, the bit patterns in succeeding columns are shifted by different amounts. While not essential to the test architecture, phase shifter 430 improves the operation of the test circuitry.

The pseudorandom bit patterns that are generated by PRPG 420 and phase shifter 430 are loaded into scan chains 440. Each of scan chains 440 comprises a series of scan latches that are configured to alternately shift data (the pseudorandom bit patterns or functional logic output) through the scan chains or to hold data that has been propagated through the functional logic. As indicated above, a separate sequence is loaded into each of scan chains 440. Each of scan chains 440 is positioned before or after (interposed with) respective portions of logic circuit 450. Thus, for each portion of logic circuit 450, there is a scan chain which precedes this portion and provides inputs to the corresponding logic, as well as a scan chain which follows this portion and receives the output of the corresponding logic. For example, one portion of logic circuit 450 may receive input bits from scan chain 441 and provide output bits to scan chain 442. Similarly, another portion of logic circuit 450 may receive input bits from scan chain 443 and provide output bits to scan chain 444. Some of scan chains 440 may serve both to provide input bits to a succeeding portion of logic circuit 450 and to receive output bits from a preceding portion of logic circuit 450.

After the pseudorandom bit patterns have been allowed to propagate through the functional components of logic circuit 450 and the results have been captured in scan chains 440, the contents of scan chains 440 are scanned out of the scan chains (i.e., they are unloaded from the scan chains) to compactor 460 and MISR 470. The purpose of compactor 460 is simply to reduce the number of bits that have to be handled by MISR 470. Compactor 460 may be implemented in a number of ways. Typically, compactor 460 will employ a series of XOR gates, where the output of each XOR gate is based upon inputs received from a pair of scan chains. The number of bits that are then passed to MISR 470 can therefore be reduced by a factor of 2. In alternative environments, more complex circuitry may allow the number of bits to be reduced by an even greater factor.

After the bits from scan chains 440 have been compacted by compactor 460, they are provided to MISR 470. MISR 470 provides a means to observe the resulting data bits and to compare this information to the expected output of the test system. In one embodiment, MISR 470 performs a modulo operation on the output of compactor 460. That is, MISR 470 divides the current value stored in MISR 470 by the output of compactor 460, and retains the remainder from this computation. This computation is performed, and the value stored in MISR 470 is updated, after each functional cycle. After a predetermined number of functional cycles, the value stored in MISR 470 is compared to an expected value. If the stored value does not match the expected value, then one or more of the operations performed by the functional components of logic circuit 450 failed, thereby providing an incorrect data bit in the output scan chain, which then propagated through compactor 460 to MISR 470.

Referring to FIG. 5, LBIST circuitry 110 is controlled by LBIST controller 120. As noted above, LBIST controller 120 is designed to control the speed of LBIST circuitry 110 to adjust the power expended within the device under test and thereby adjust the temperature of the device. The diagram of FIG. 5 therefore illustrates the components of LBIST controller 120 that control this part of the operation of LBIST circuitry 110. It should be noted that LBIST controller includes other components that control other functions of the LBIST system, but these components are not shown in figure, since they are well known and understood in the field of the invention.

Referring to FIGS. 1 and 5, LBIST controller 120 is coupled to thermal sensor 130, which is in thermal communication with the device under test. "Thermal communication" is used hereto referred to the fact that thermal sensor 130 is in close enough proximity to the device under test that the temperature of the device can be effectively sensed. Thermal sensor 130 may be incorporated into the device under test, or it may alternatively be external to the device. If thermal sensor 130 is external to the device under test, the sensor should be in contact with the device or close enough to the device that the temperature of the device can be determined with acceptable certainty (e.g., within a predetermined number of degrees.)

Referring again to FIG. 5, a signal indicative of the temperature sensed by thermal sensor 130 is received by decoder 510. Decoder 510 decodes the temperature signal from thermal sensor 130 and forwards the decoded signal to comparator 520. Comparator 520 compares the decoded temperature signal to one or more threshold temperature values that are stored in registers 525. As described above, these threshold values may include a high temperature threshold (THI), a low temperature threshold (TLO,) or a single temperature value that serves as both a high and low temperature threshold. Based upon the comparison of the decoded temperature value with the one more threshold values from registers 525, comparator 520 makes a determination as to whether the currently selected scan shift speed for LBIST circuitry 110 is too high, too low, or within an acceptable temperature range.

As the result of this determination, comparator 520 generates a signal that is provided to scan shift speed selector 530. Scan shift speed selector 530 is coupled to a set of registers 535 that store corresponding scan shift speed values. Based upon the signal received from comparator 520, scan shift speed selector 530 selects one of registers 535 and provides the corresponding value to comparator 540. If comparator 520 determines that the temperature indicated by thermal sensor 130 is within an acceptable range, the signal that is provided to scan shift speed selector 530 causes scan shift speed selector to maintain the current selection. In other words, the one of registers 535 that was previously selected remains selected, and the same value is provided to comparator 540. If, on the other hand, comparator 520 determines that the temperature indicated by thermal sensor is too high or too low, the comparator generates a signal that causes scan shift speed selector 530 to select a different one of registers 535 and thereby provide a different value to comparator 540.

The purpose of comparator 540 is to generate a signal (which will be referred to below as a gate signal) that can be provided to AND gate 560 to control a clock signal that is generated by phase locked loop (PLL) 570. When comparator 540 asserts the gate signal provided to AND gate 560, a clock pulse from PLL 570 is provided to LBIST circuitry 110, causing the scan shift process within LBIST circuitry 110 to advance. The frequency with which the clock pulses are provided to LBIST circuitry 110 determines the scan shift speed of the LBIST circuitry, hence the power consumption and heat generation of the LBIST circuitry.

Comparator 540 generates the gate signal provided to AND gate 560 by comparing the value received from scan shift speed selector 530 to a value received from binary counter 550. When the values received from scan shift speed selector 530 and binary counter 550 match, comparator 540 asserts the gate signal, thereby allowing a clock pulse from PLL 570 to be provided to LBIST circuitry 110. In one embodiment, binary counter 550 is incremented at the same rate at which PLL 570 generates clock pulses (i.e., the maximum scan shift speed.) When binary counter 550 reaches the value selected by scan shift speed selector 530, comparator 540 asserts the signal to AND gate 560 and resets binary counter 550, which begins counting again from zero.

Thus, if scan shift speed selector 530 selects one of registers 535 containing a value of 1, the values received by comparator 540 from scan should speed selector 530 and binary counter 550 match every time binary counter 550 is incremented. The gate signal provided to AND gate 560 is therefore always asserted, and the clock signal generated by PLL 570 is simply passed through AND gate 560 to LBIST circuitry 110. If, the other hand, scan shift speed selector 530 selects a higher value from one of registers 535, comparator 540 will assert the gate signal only after binary counter 550 has incremented through the selected number of values. For example, if scan shift speed selector 530 selects a value of 8, comparator 540 will assert the gate signal when binary counter 550 reaches this value, then will deassert the gate signal and reset the binary counter. This cycle will be repeated every eighth time binary counter 550 is incremented, and the clock signal provided to LBIST circuitry 110 will be gated at ⅛ of the maximum scan shift speed.

In one embodiment, the desired test temperature will be constant. It is contemplated that, when burn-in testing is initiated, the temperature of the device under test will be less than the desired temperature. As a result, in this embodiment, comparator 520 will initially cause scan shift speed selector 530 to select the maximum scan shift speed. As the temperature of the device under test increases, comparator 520 will adjust the signal provided to scan shift speed selector 530 to choose an appropriate value from registers 535 to reduce the scan shift speed of LBIST circuitry 110. It is expected that a sort of equilibrium will be reached, where a particular value is selected most of the time, with higher or lower values being selected to temporarily increase or decrease the scan shift speed and consequently adjust the temperature of the device under test.

It should be noted that, in alternative embodiments, it may be desirable to implement a temperature profile that varies with time, rather than remaining constant. In such embodiments, LBIST controller 120 may be configured in an alternative manner, so as to modify the target temperature range with time. It should also be noted that LBIST controller 120 may be designed to enable software configurability. That is, LBIST controller 120 may be modifiable via software to change such things as the algorithms used to select scan shift speeds, the register values for the selectable scan shift speeds, the threshold temperature values, and the like.

Figure 6:
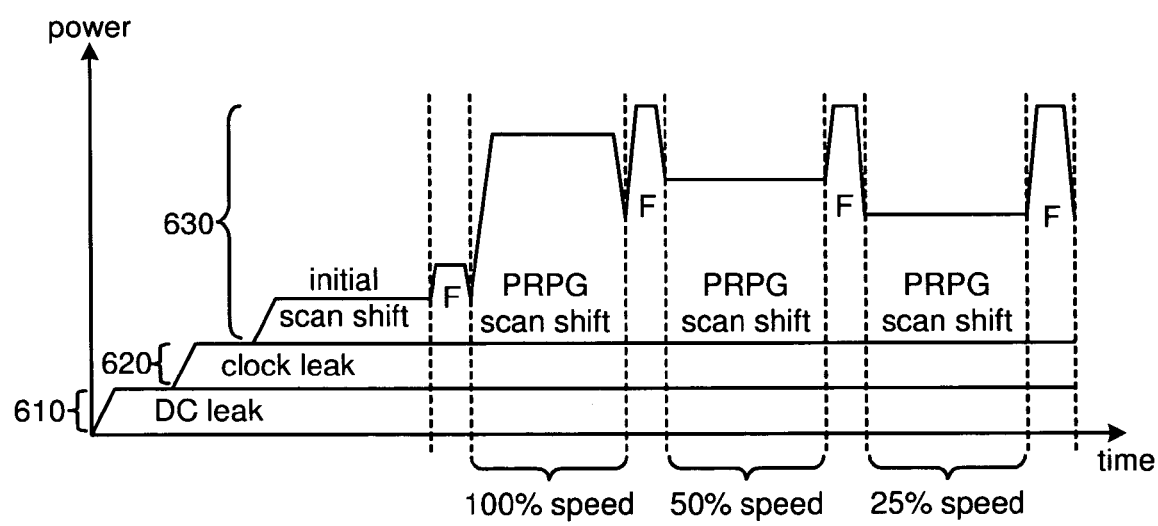
FIG. 6 is a diagram illustrating the power consumed by a device under test with respect to varying scan shift speeds in accordance with one embodiment.

Referring to FIG. 6, the effect of varying the scan shift speed of LBIST circuitry 110 with respect to power is illustrated. FIG. 6 is a graph of power expended by the device under test (including the LBIST circuitry) as a function of time. It should be noted that this figure is provided merely to illustrate the variations in power corresponding to changing scan shift speeds, and is not intended to be to-scale, or to accurately account for all power drains or heat sources.

As depicted in FIG. 6, the power that is used by the device under test includes three components. The first component, 610, is the power expended by DC leakage in the device. As noted above, this is the power that is consumed by the device simply by virtue of being powered on. The second component, 620, is the power expended as a result of clock leakage. This is the amount of power that is consumed as a result of minimal operation of the device (i.e., the system clock is operational, but the device is not performing any useful processes.) The third component, 630, is the power that is expended as a result of LBIST operation within the device. This is the power consumed by the LBIST circuitry in the process of shifting (scanning) data into and out of the LBIST scan chains and performing related processing, as well as the power consumed by the functional logic of the device in propagating the data between LBIST scan chains.

It can be seen in FIG. 6 that the DC leakage component (610) of the power used by the device under test is roughly constant over time. Similarly, clock leakage component 620 is relatively constant. The portion of the power attributable to LBIST operation of the device (630,) however, various over time, depending upon the phase of operation and, in one embodiment, the speed of operation.

The operational component (630) of the power can be broken down into phases. As described above, the LBIST circuitry operates alternately in a scan shift phase and a functional phase. The scan shift phases depicted in FIG. 6 are labeled accordingly, while the functional phases in the figure are simply labeled with an "F." During the scan shift phase, data is scanned into and out of of the scan chain components of the LBIST circuitry. During the functional phase, the data in a scan chains is propagated through the functional logic of the device under test and then captured in subsequent scan chains. Thus, a test cycle of scanning data into/out of the scan chains and then propagating the data through the functional logic is continually repeated. Four of these test cycles are depicted in FIG. 6.

It can be seen that, in the first test cycle, the scan shift and functional phases make a relatively minor contribution to the overall power of the device under test. This may or may not be true in all embodiments. After the initial test cycle, the functional operation of the device proceeds at full speed (and full power,) and the scan shift operation proceeds at an appropriate speed, as determined by the LBIST controller. In this embodiment, the operation of the device during each functional phase is carried out at the normal operating speed of the device (full speed/power.) The power expended during each functional phase is based upon the pseudorandom data generated by the LBIST circuitry, and is therefore relatively constant. That is, roughly the same amount of power is expended during each functional phase. The power levels of the functional phases are therefore depicted in the figure as being constant.

It can be seen from FIG. 6 that the power levels corresponding to the scan shift phases, unlike the power levels corresponding to the functional phases, vary from one scan shift phase to the next. As explained above, these varying power levels result from the varying scan shift speeds for each of the scan shift phases, as determined by the LBIST controller, based on input from the thermal sensor. During scan shift phases in which the power is relatively low, relatively little heat is generated by the device. During scan shift phases in which the power is relatively high, more heat is generated by the device, thereby controlling the temperature of the device during burn-in testing.

It should be noted that many variations of the components and features described in connection with the foregoing embodiments will be apparent to persons of skill in the art of the invention, and that such variations are within the scope of the present disclosure. Such variations may include, but are not limited to, implementations in various types of devices (e.g., microprocessors, non-microprocessor integrated circuits, etc.,) implementations of the LBIST controller that are internal/external to the device under test, variations in the control algorithms implemented by the LBIST controller, variations in the aspects of LBIST operation that are controlled by the controller (e.g., scan shift speed, intervals for scan shift/functional phases, etc.,) the types of test parameters maintained by controlling the LBIST circuitry (e.g., temperature, power, etc.,) and the like.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. An exemplary storage medium is coupled to a processor such the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention.

Thus, the present invention is not intended to be limited to the embodiments shown herein but is to be accorded the widest scope consistent with the principles and novel features disclosed herein and recited within the following claims.

What is claimed is:

1. A device comprising:
a logic built-in self test (LBIST) controller configured to
receive signals from one or more thermal sensors, wherein the signals correspond to temperatures of one or more devices under test,
determine whether the temperatures of the one or more devices under test are at desired levels, and
generate control signals to drive LBIST circuitry within the one or more devices under test, wherein the control signals drive LBIST circuitry to generate more heat when the temperatures of the one or more devices under test are below desired levels and to generate less heat when the temperatures of the one or more devices under test are above desired levels;
wherein the LBIST controller includes a scan shift speed selector configured to select scan shift speeds at which the LBIST controller drives the LBIST circuitry within the one or more devices under test.

2. The device of claim 1, wherein the LBIST controller includes a first comparator configured to compare the temperatures of the one or more devices under test to one or more threshold temperature values.

3. The device of claim 2, wherein the first comparator is coupled to one or more registers which are configured to store upper and lower threshold values, and wherein the first comparator is configured to compare the temperatures of the one or more devices under test to an upper threshold temperature value to determine whether the temperatures of the one or more devices under test are above the desired levels and to compare the temperatures of the one or more devices under test to a lower threshold temperature value to determine whether the temperatures of the one or more devices under test are below the desired levels.

4. The device of claim 1, wherein the scan shift speed selector is coupled to a plurality of registers which are configured to store scan shift speed values that are selectable by the scan shift speed selector.

5. A device comprising:
a logic built-in self test (LBIST) controller configured to
receive signals from one or more thermal sensors, wherein the signals correspond to temperatures of one or more devices under test,
determine whether the temperatures of the one or more devices under test are at desired levels, and
generate control signals to drive LBIST circuitry within the one or more devices under test, wherein the control signals drive LBIST circuitry to generate more heat when the temperatures of the one or more devices under test are below desired levels and to generate less heat when the temperatures of the one or more devices under test are above desired levels,
wherein the LBIST controller includes a second comparator configured to compare the selected scan shift speeds to a binary counter, and wherein the second comparator is configured to generate a gating signal.

6. The device of claim 5, further comprising an AND gate and a phase locked loop circuit (PLL), wherein the AND gate is configured to receive a clock signal from the PLL and the gating signal from the second comparator and to generate a gated clock signal that is provided to the LBIST circuitry within the one or more devices under test.

7. The device of claim 5, wherein the LBIST controller includes a first comparator configured to compare the temperatures of the one or more devices under test to one or more threshold temperature values.

8. The device of claim 5, wherein the first comparator is coupled to one or more registers which are configured to store upper and lower threshold values, and wherein the first comparator is configured to compare the temperatures of the one or more devices under test to an upper threshold temperature value to determine whether the temperatures of the one or more devices under test are above the desired levels and to compare the temperatures of the one or more devices under test to a lower threshold temperature value to determine whether the temperatures of the one or more devices under test are below the desired levels.

* * * * *